United States Patent [19]
Redman

[11] 3,939,479
[45] Feb. 17, 1976

[54] WAVEFRONT FLATTENER

[75] Inventor: Charles M. Redman, Las Cruces, N. Mex.

[73] Assignee: The United States of America as represented by the Secretary of the Army, Washington, D.C.

[22] Filed: July 12, 1974

[21] Appl. No.: 487,948

[52] U.S. Cl. .............................. 343/753; 343/911 R
[51] Int. Cl.² ......................................... H01Q 19/06
[58] Field of Search ........... 343/753, 754, 755, 909, 343/911 R

[56] References Cited
UNITED STATES PATENTS

| | | | |
|---|---|---|---|
| 2,705,753 | 4/1955 | Jaffe | 343/755 |
| 3,331,073 | 7/1967 | Horst | 343/755 |

*Primary Examiner*—Eli Lieberman
*Attorney, Agent, or Firm*—Nathan Edelberg; Robert P. Gibson; Saul Elbaum

[57] ABSTRACT

A wavefront flattener comprising an input surface, an output surface parallel to said input surface, said input surface and said output surface comprising concentric rings of dielectric material, said concentric rings having a high dielectric constant at the center thereof dropping to a low dielectric constant at the outermost rings whereby electromagnetic radiation is crowded into the center of said input and output surfaces to cause a flattening of a curved electromagnetic radiation wavefront.

1 Claim, 3 Drawing Figures

U.S. Patent  Feb. 17, 1976  3,939,479
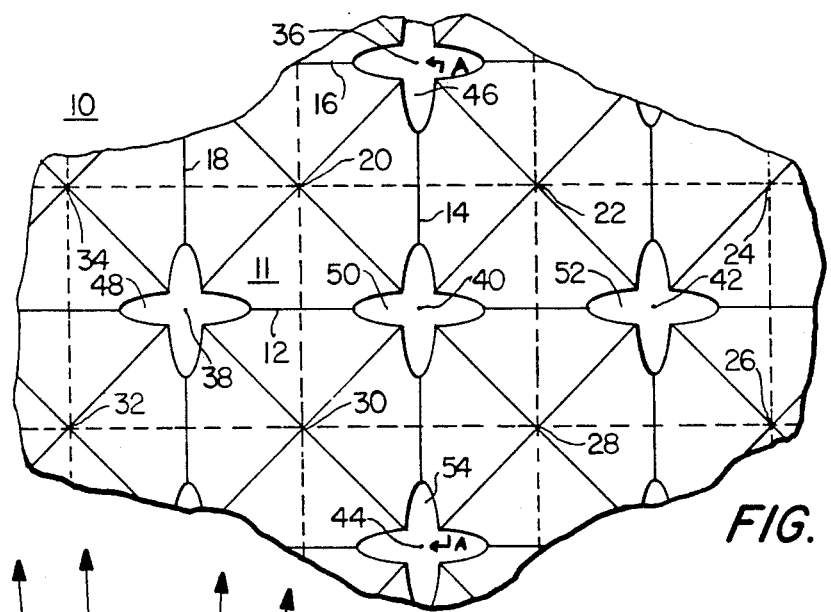
FIG. 1
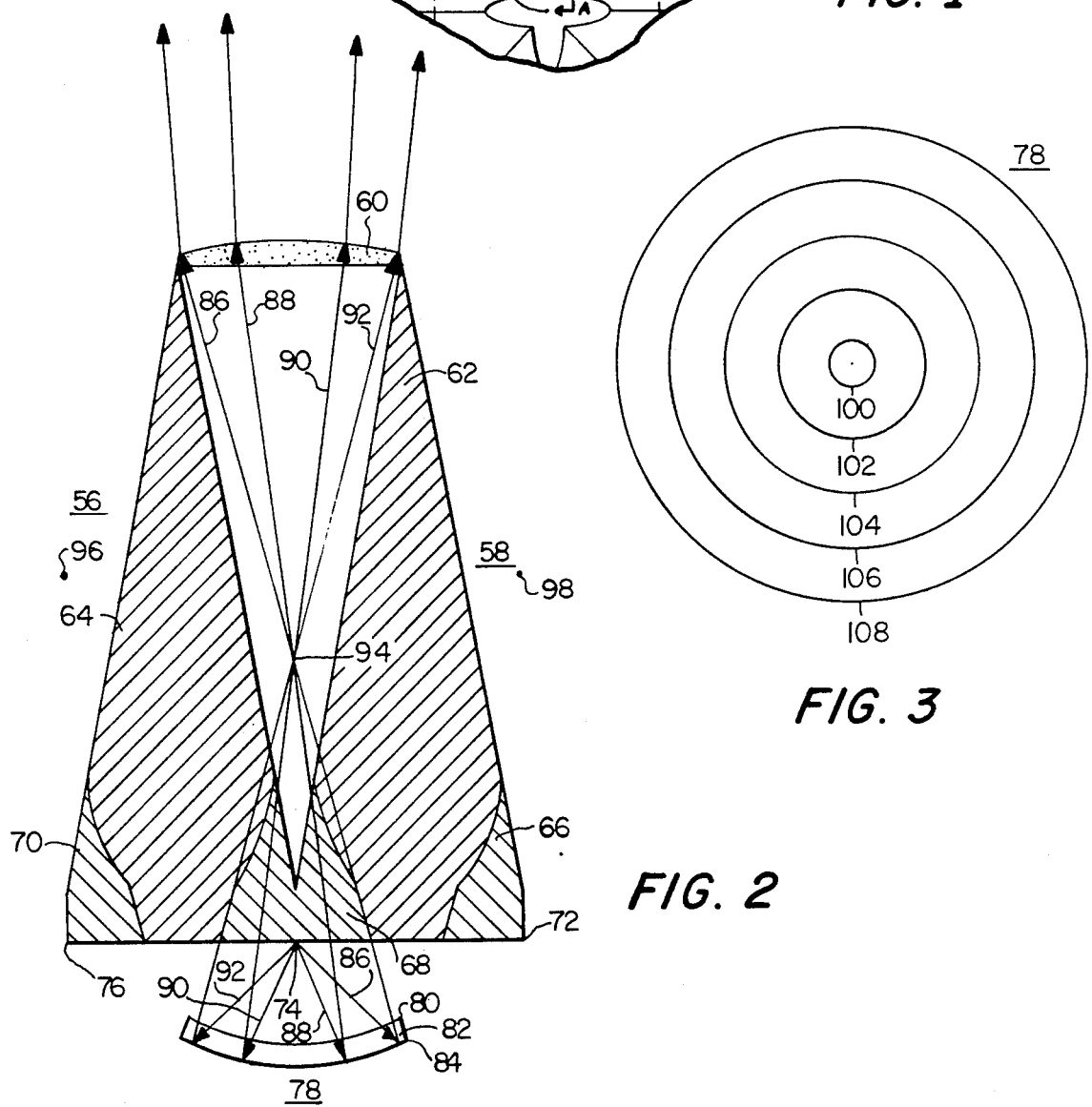
FIG. 2
FIG. 3

WAVEFRONT FLATTENER

RIGHTS OF GOVERNMENT

The invention described herein may be manufactured, used and licensed by or for the Government of the United States for governmental purposes without the payment to me of any royalty thereon.

BACKGROUND OF THE INVENTION

1. Field of the Invention

This invention relates to a wavefront flattener and, more particularly, to a unique and novel wavefront flattener which may be used in a radar test chamber which requires a very large angle simulation test array with thousands of RF elements wherein each element must radiate a wave which becomes essentially flat at a distance of 100 feet over an area of 450 square feet.

2. Description of the Prior Art

RF anechoic chambers are widely used for antenna pattern measuring and to a lesser extent for RF quiet areas for test and evaluation of missiles and radars which utilize antennas. These chambers are excellent test areas for smaller antenna systems. However, for larger and higher frequency devices, there is a serious limitation, i.e., a c-band 8 foot diameter antenna system would require a building 800 or more feet long. This problem is caused primarily by the curvature of the wavefront. Generally, the wavefront is flat enough when the range does not exceed two times the square of the diameter of the antenna divided by the wave length of the RF. In some instances, it is possible to use a very large lens or a parabolic section to collimate the wavefront to flatten it. However, these solutions are not satisfactory where a large device is not possible or is objectionable.

SUMMARY OF THE INVENTION

It is therefore, a primary object of the present invention to provide a wavefront flattener which can be used in an environment where a very large lens or a parabolic section is not desirable.

Another object of the present invention is to provide a wavefront flattener which can be used in a radar test chamber.

A further object of the present invention is to provide a wavefront flattener which is of simple and uncomplicated construction and which can, when used in combination with an RF element, generate a flat wave at a distance of 100 feet over an area of 450 square feet.

The foregoing and other objects are obtained in accordance with the present invention with a wavefront flattener comprising an input surface, an output surface parallel to the input surface, the input surface and the output surface comprising concentric rings of dielectric material, the rings having a high dielectric constant at the center thereof which drops to a low dielectric constant at the outermost rings whereby electromagnetic radiation is crowded into the center of the input and output surfaces to cause a flattening of a curved electromagnetic radiation wavefront.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings, in which:

FIG. 1 is a sectional view of an angle simulation test array comprised of pyramids of RF absorber material.

FIG. 2 is a view taken along lines A—A of FIG. 1 and shows a waveform flattener in accordance with the present invention.

FIG. 3 is a top view of the waveform flattener of the present invention.

DETAILED DESCRIPTION OF A PREFERRED EMBODIMENT

As mentioned above, in some instances, a very large lens or a parabolic section can be used to collimate a wavefront in order to flatten it. However, these solutions are not satisfactory in those instances where a large device is impossible or is objectionable. One such instance where a large parabolic section or a large lens is not a satisfactory solution is the radar test chamber. The radar test chamber requires a very large angle simulation test array which includes thousands of RF elements. Each element must radiate a wave which is essentially flat at a distance of 100 feet over an area of 450 square feet.

FIG. 1 shows a section of an angle simulation test array generally designated as 10. Array 10 is built of pyramids of RF absorber material three feet high and one foot square at the base such as pyramid 11 which has a base comprised of sides 12, 14, 16 and 18 and has a peak designated as 20. The pyramids are mounted base to base in rows and columns as shown in FIG. 1 wherein peaks 20, 22, 24, 26, 28, 30, 32 and 34 are designated. At those points where four pyramids come together, such as 36, 38, 40, 42, and 44, a circular cone is cut into each of the pyramids with the large end of the cone at the base of the pyramids. These sections which have been cut out for microwave transmission are identified in FIG. 1 by the designations 46, 48, 50, 52 and 54. The infrared microwave lenses are shown in FIG. 1 through the use of dashed lines.

FIG. 2 is a view of the angle simulation test array of FIG. 1 along line AA. Two RF absorber pyramids designated 56 and 58 are shown in FIG. 2. At the apex of pyramids 56 and 58 is disposed infrared microwave lens 60. Sections 62 and 64 indicate the cross section of the pyramids for microwave transmission. Microwave energy originates at points 72, 74 and 76, however, only the microwave energy originating at point 74 is shown in detail.

The waveform flattener is generally designated as 78 and comprises input surface 80 and output surface 82. A reflective backing 84 is attached to output surface 82. Four rays 86, 88, 90 and 92 are shown being reflected by waveform flattener 78. The reflective backing and the waveform flattener converge the RF energy to a point 94. Similar points 96 and 98 exist with respect to RF signals radiated from points 76 and 72 respectively. The four rays diverge from point 94 to the infrared microwave lens 60 as shown in FIG. 2. As shown in FIG. 2, as rays 86, 88, 90 and 92 pass through lens 60 they are caused to diminish their respective divergences. The divergence from lens 60 is such that energy through this 1 foot square lens 60 expands to cover 450 square feet at a distance of 100 feet. Without the waveform flattener, the wavefront at 100 feet from the lens 60 would be curved to such an extent that an antenna pattern would be erroneous.

A top view of waveform flattener 78 is shown in FIG. 3. Waveform flattener 78 is shown as comprised of dielectric material comprised of concentric rings 100, 102, 104, 106 and 108. The material circumscribed by ring 100 is of a high dielectric constant. The material found between rings 106 and 108 is of a much lower dielectric constant. The dielectric constant becomes less the further the distance from the center of waveform flattener 78. This is similar to a slab cut from the center of a lunberg lens.

Since the dielectric at the center of waveform flattener 78 has a high constant when compared to that of the edge, the center portion of waveform flattener 78 contains more cycles of the microwave signal than does the edge, i.e. about 2.5 wave lengths more than the edge. A wave length at 5,450 MHz is 0.1805 feet so that it is necessary for waveform flattener 78 to have considerable thickness as well as dielectric change. The actual thickness may be reduced because of recognition of the fact that the RF signal goes through waveform flattener 78 twice.

Although the wavefront flattener of the present invention has been disclosed with respect to an infrared microwave transponder, it will be clear to those in the art that the waveform flattener of the present invention may be used with any other microwave sources or receivers where a curved wavefront is a problem. Further, although the wavefront flattener of the present invention has been disclosed as having curved faces, flat faces may be utilized for some applications. Still further, although the wavefront flattener of the present invention has been disclosed as a "twice through" element with a reflective backing, the present invention also contemplates a wavefront flattener wherein the signal passes only once therethrough.

I wish it to be understood that I do not desire to be limited to the exact details of construction shown and described, for obvious modifications can be made by a person skilled in the art.

What is claimed as new and desired to be secured by Letters Patent of the United States is:

1. A wavefront flattener comprising:
an input surface,
an output surface parallel to said input surface,
said input surface and said output surface being dish shaped,
said input surface and said output surface comprising concentric rings of dielectric material,
said concentric rings having a high dielectric constant at the center thereof dropping to a low dielectric constant at the outermost rings, a reflective backing mounted on said output surface
whereby electromagnetic radiation is crowded into the center of said input and output surfaces to cause a flattening of a curved electromagnetic radiation wavefront.

* * * * *